United States Patent
Li

(10) Patent No.: US 8,926,321 B2
(45) Date of Patent: Jan. 6, 2015

(54) HEATING METHOD FOR MAINTAINING A STABLE THERMAL BUDGET

(75) Inventor: Chunlong Li, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 484 days.

(21) Appl. No.: 13/379,242

(22) PCT Filed: Aug. 9, 2011

(86) PCT No.: PCT/CN2011/001313
§ 371 (c)(1),
(2), (4) Date: Dec. 19, 2011

(87) PCT Pub. No.: WO2012/145871
PCT Pub. Date: Nov. 1, 2012

(65) Prior Publication Data
US 2012/0270165 A1 Oct. 25, 2012

(30) Foreign Application Priority Data
Apr. 25, 2011 (CN) .......................... 2011 1 0104354

(51) Int. Cl.
*H01L 21/30* (2006.01)
*H01L 21/28* (2006.01)
*H01L 21/324* (2006.01)

(52) U.S. Cl.
CPC ........ *H01L 21/28211* (2013.01); *H01L 21/324* (2013.01)
USPC ............................. 432/247; 438/758; 438/795

(58) Field of Classification Search
USPC ........... 432/247; 118/724, 725; 438/758, 795, 438/509, 677
See application file for complete search history.

(56) References Cited

U.S. PATENT DOCUMENTS

| 6,265,261 | B1 | 7/2001 | Kim | |
| 6,747,254 | B2 * | 6/2004 | Kim et al. | 219/635 |
| 6,815,223 | B2 * | 11/2004 | Celinska et al. | 438/3 |
| 8,293,646 | B2 * | 10/2012 | Ozaki et al. | 438/677 |
| 2010/0144161 | A1 * | 6/2010 | Nakamura | 438/767 |

FOREIGN PATENT DOCUMENTS

CN 1088259 C 7/2002

OTHER PUBLICATIONS

International Search Report for PCT/CN2011/001313.

* cited by examiner

*Primary Examiner* — Gregory A Wilson
(74) *Attorney, Agent, or Firm* — Troutman Sanders LLP

(57) ABSTRACT

The present invention discloses a heating method for maintaining a stable thermal budget. By following the primary procedure with a virtual procedure in such a manner that the total duration of the whole heating process remains constant, it is beneficial to maintain a stable thermal budget and further to maintain a stable device performance.

7 Claims, 1 Drawing Sheet

HEATING METHOD FOR MAINTAINING A STABLE THERMAL BUDGET

This application is a National Phase application of, and claims priority to, PCT Application No. PCT/CN2011/001313, filed on Aug. 9, 2011, entitled "HEATING METHOD FOR MAINTAINING A STABLE THERMAL BUDGET", which claimed priority to Chinese Application No. 201110104354.7, filed on Apr. 25, 2011. Both the PCT Application and Chinese Application are incorporated herein by reference in their entireties.

FIELD OF THE INVENTION

The present invention relates to a method for manufacturing a semiconductor device, and particularly to a heating method for maintaining a stable thermal budget.

BACKGROUND OF THE INVENTION

Under the promotion of Moore's Law, the semiconductor industry has developed rapidly during the past decade. With the development of more complicated process technology, a well controlled process thermal budget is becoming more important for the semiconductor fabrication. For example, when the integrated circuit enters the deep sub-micrometer and nanometer scale, the critical dimension reduces continuously. However, impurity ions in the doped region formed by ion implantation or diffusion accumulate energy during the repeated thermal treatments. This energy may be enough for the impurity ions to free from the substance of the substrate and diffuse into the neighboring regions of reduced spacing, and this always results in device failure.

During the semiconductor manufacturing procedure, most of the heat comes from the heating steps like thermal oxidation, thermal annealing, thermal diffusion, vacuum evaporation, and CVD, etc, since all heating steps generally involve heating treatment at a high temperature for a long time. However, as for the heating procedure, sometimes it is required to adjust the primary process duration to ensure a thin film with a certain thickness on the target object. For example, as for the thermal oxidation, in case that dry oxygen oxidation is performed at 800° C. on (100) crystallographic plane of Si, when the moisture content in the oxidant atmosphere is less than 1 ppm, an oxide layer with a thickness of 300 Å is formed by oxidation for 700 min A longer time is required to form a thicker oxide layer. The thickness of the oxide layer shows substantially a linear relation with the required time, which to some extent also implies that a thicker oxide layer would require more thermal budget.

It is important that the primary process is mostly a treatment step with the highest temperature. For instance, as for the fabrication of silicon oxide, the primary process is, for example, oxidation, in which the temperature ranges from 800 to 1300° C. or so, the duration of heating treatment is generally in the order of ten minutes, several hours, or a dozen of hours. On the contrary, the duration of thermal annealing is generally in the order of some minutes or some seconds, so that annealing at 300° C. can essentially remove defects which are introduced by the low-dose damage of $Sb^+$ implanted into Si. The duration of CVD is generally the order of some minutes, with the temperature ranging from 300 to 750° C. or so. Furthermore, among the step procedures for heating in the furnace, the primary process takes a relatively long time. As can be seen, the thermal oxidation can best represent the primary process which is performed at high temperature for a long time, and to a great extent determines the thermal budget of the semiconductor process. Therefore, changing the treatment duration of the primary process will eventually result in significant variation in the thermal budget of the device.

Furthermore, when the thermal budget shows a relatively large variation, further process on the wafer may cause the wafer subject to a total thermal energy beyond the requirements to maintain the stability of the device. That is, when the thermal budget increases suddenly, if the subsequent process can not leave adequate margin according to the thermal budget, the total thermal budget of the device may be exceeded and the diffusion is out of control to result in the device failure.

In a word, there is a need for a method for optimizing heating procedures which is capable of maintaining a stable thermal budget, in order to reduce manufacturing cost and save the process duration.

OBJECT AND SUMMARY OF THE INVENTION

In view of the above, the object of the present invention is to provide a method for optimizing heating procedures to maintain a stable thermal budget.

The present invention provides a heating method for maintaining a stable thermal budget, comprising:

a heating step for increasing the temperature in a reaction furnace from a first temperature to a second temperature;

a primary procedure step for forming a thin film by treating a wafer, which occupies a first duration T1;

a virtual process step, which occupies a second duration T2;

a cooling step for decreasing the temperature in the reaction furnace from the second temperature to the first temperature, the method is characterized in that the sum of said first and second duration is a constant.

Herein, the primary procedure involves forming an oxide film by thermal oxidation. The constant is determined according to the control on the thickness of the film formed by the primary procedure. Herein, the first duration T1 and the second duration T2 can be adjusted. Herein, $T1+T2=(1+\alpha)\times T0$, wherein T0 is the arithmetic average of the durations of primary procedures in various batches, and a is the ratio between the maximum change in the durations of primary procedures in various batches and T0. Herein, a is less than or equal to 10%. Herein, the virtual process step is to anneal in $N_2$ atmosphere.

According to the method for optimizing heating procedures of the present invention, by following the primary procedure with a virtual procedure in such a manner that the total duration of the whole heating process remains constant, it is beneficial to maintain a stable thermal budget and further to maintain a stable device performance.

The object as described above and other objects not set forth herein can be achieved by the independent claim of the present application. The embodiments of the present invention are defined in the independent claim, and the specific features are defined in its dependent claim.

BRIEF DESCRIPTION OF THE DRAWINGS

The technical solution of the present invention will be described in details with reference to the accompanying drawings, in which.

DETAILED DESCRIPTION OF EMBODIMENTS

Figure 1:
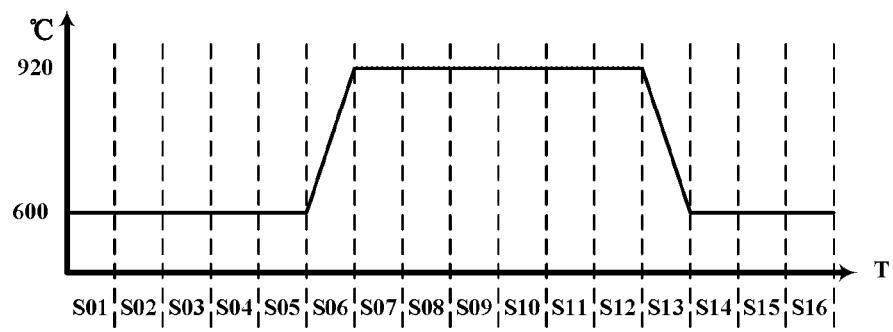
FIG. 1 is a schematic view of each heating procedure in the prior art.

The features of the technical solution of the present invention and the technical effects thereof will be described in details hereinafter with reference to the accompanying drawings and the exemplary embodiments. A method for optimizing heating procedures to maintain a stable thermal budget is disclosed. It is noted that similar reference numerals indicate similar structures. The terms "first", "second", "over", "below" or the like as used in the present application can be used to modify each fabrication procedure. Unless specifically stated otherwise, these modifications are by no means to imply the spatial, sequential or hierarchical relationships between the fabrication procedures.

FIG. 1 is a schematic view showing an example of the heating procedure in the prior art. The horizontal axis represents time, and particularly represents the duration of each step in the whole heating procedure. The vertical axis represents the temperature in the reaction furnace (in ° C.). It is noted that FIG. 1 is merely a schematic view, and the durations occupied by each step are not illustrated strictly to scale. As for the specific start and end time of each step, reference can be made to Table 1.

Generally, the whole heating procedure comprises the following steps.

Step S01, standing by, which usually represents the start of the heating procedure flow, namely the origin or zero point of the time, and it is timed as 0 hour 0 minute 0 second. At this time, the temperature in the reaction furnace is the residual temperature in the furnace after the previous batch of thermal treatment, and is called as the first temperature. In the embodiment set forth in the present invention, the first temperature in the furnace is for example constant at 600° C.

Step S02, waiting, during which a control system which is connected with the furnace is started and it is waited to input a process parameter. The duration for this step is generally 1 minute. In other words, step S02 ends at 0 hour 01 minute 0 second.

Step S03, preloading, during which a door of the furnace is opened, a transferring means like a machine arm picks up successively wafer boxes containing the wafers to be processed from the conveyer belt, and transfers them onto a susceptor in the furnace. This process relies on the quantity of the wafer and the duration of mechanical manipulation. As for a mechanical system capable of conveying the wafer by 100 mm per minute (i.e., the throughput capacity of the transferring system is 100mm/min), the step S03 of the present invention embodiment will take 20 minutes. Namely, the step S03 ends at 0 hour 21 minutes 0 second.

Step S04, checking, during which the control system checks whether the furnace door or furnace cover closes completely by means of a checking means (e.g. a mechanical, electromagnetic or optical sensor) arranged at the furnace door. The checking process takes 10 seconds. Namely, step S04 ends at 0 hour 21 minutes 10 seconds.

Step S05, stabilizing, which serves to await until the atmosphere in the furnace comes to an equilibrium again, since the furnace door is opened during loading which will certainly result in disturbances in the atmosphere and temperature in the furnace. This process takes 15 minutes. Namely, step S05 ends at 0 hour 36 minute 10 seconds.

Step S06, heating, during which a furnace temperature control system controls, according to the instruction input during waiting in step S02, a heating device (e.g., an electromagnetic coupling coil) to heat the atmosphere in the furnace. The heating rate is for example 5° C./min, and heating is stopped upon reaching the desired second temperature. The second temperature is for example 920° C. This process takes 64 minutes. Namely, step S06 ends at 1 hour 40 minutes 10 seconds.

Step S07, recovering, during which it is waited to come to an equilibrium again in the furnace, since the heating is inevitably not uniform and results in turbulence in the furnace. At the same time, a rotating mechanism of the susceptor in the furnace is started to ensure that, during the subsequent thermal treatment, the wafer is treated uniformly in all directions. Step S07 takes 15 minute. Namely, step S07 ends at 1 hour 55 minutes 10 seconds.

Step S08, igniting, during which pure oxygen or moisture is introduced as a oxygen precursor for forming silicon oxide. The duration of this step can specifically be determined by the flow or flow rate, and may for example be 1 minute. Namely, step S08 ends at 1 hour 56 minutes 10 seconds.

Step S09, primary procedure, e.g., thermal oxidation, the duration of which is determined and can be adjusted according to the thickness of the thin film to be formed. A thin film formed in the embodiment of the present invention for example takes 15 minute. Namely, step S09 ends at 2 hours 11 minutes 10 seconds.

Step S10, extinguishing, during which the introduction of pure oxygen and moisture is stopped. This process takes 1 minute, and ends at 2 hours 12 minutes 10 seconds.

Step S11, purging $O_2$ at a late stage, during which a vacuum pump is started to pump $O_2$ or moisture out of the furnace. This process takes 5 minutes, and ends at 2 hours 17 minutes 10 seconds.

Step S12, purging $N_2$, during which a chemical inert gas, such as $N_2$, Ar or the like which does not react with the wafer under the current process conditions, is introduced to further discharge the residual reaction gases in the furnace. At the same time, the introduced inert gases also facilitate the subsequent cooling treatment, because the cooling process will take a very long time if there is no gas medium for heat conduction in a high vacuum environment. Step S12 takes 15 minutes, and ends at 2 hours 32 minutes 10 seconds.

Step S13, cooling, during which a cooling system in the furnace is started. The temperature in the furnace is gradually decreased back to the original first temperature of 600° C. by means of circulation, convection or natural cooling of the refrigeration medium, etc. The cooling rate is 2° C./min. This process takes 160 minutes, and step S13 ends at 5 hours 12 minutes 10 seconds.

Step S14, stopping rotation, in which the rotation of susceptor is stopped after the thermal treatment is complete. This process takes 3 minutes, and ends at 5 hours 15 minutes 10 seconds.

Step S15, unloading, during which the wafers in the susceptor that have been treated are transferred by the machine arm back into the wafer box. This process is conducted in an order opposite to the preloading, and also takes 20 minutes. Step S15 ends at 5 hours 35 minutes 10 seconds.

Step S16, ending, during which the control system is closed or enters a standby mode till treatment of the next batch of wafers. The ending process takes 5 seconds, and the whole process flow ends at 5 hours 35 minutes 15 seconds.

The timing relation of each step described above is shown in the following Table 1:

| Name of step | Duration of step (hour:minute:second) | Duration of process flow (hour:minute:second) |
|---|---|---|
| standing by | 0:00:00 | 0:00:00 |
| waiting | 0:01:00 | 0:01:00 |
| preloading | 0:20:00 | 0:21:00 |
| checking | 0:00:10 | 0:21:10 |
| stabilizing | 0:15:00 | 0:36:10 |
| heating | 0:64:00 | 1:40:10 |
| recovering | 0:15:00 | 1:55:10 |
| igniting | 0:01:00 | 1:56:10 |
| primary procedure (oxidation) | 0:15:00 | 2:11:10 |
| extinguishing | 0:01:00 | 2:12:10 |
| purging $O_2$ at a late stage | 0:05:00 | 2:17:10 |
| purging $N_2$ | 0:15:00 | 2:32:10 |
| cooling | 1:40:00 | 5:12:10 |
| stopping rotation | 0:03:00 | 5:15:10 |
| unloading | 0:20:00 | 5:35:10 |
| ending | 0:00:05 | 5:35:15 |

Figure 2A:
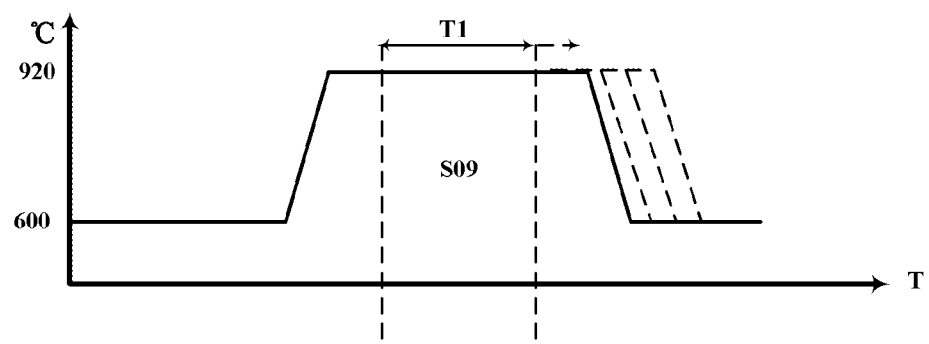
FIGS. 2A and 2B are schematic views showing relations between the duration of the primary procedure and the temperature for the heating procedure before and after being optimized according to the present invention.

It can be seen from the above description, FIG. 1, and Table 1, in an ordinary heating procedure, the primary procedure step S09 is generally adjustable. For example, referring to FIG. 2A, depending on the material, thickness, and process conditions of the thin film to be formed, the duration of the primary procedure step S09 may range from a relatively short time indicated by the solid line to a relatively long time indicated by the dashed line, and is generally in the order of ten minutes. In some cases, the step S09 may take several hours or over ten hours, which will bring about significant change in the thermal budget. In particular, the film thickness may be different in various batches, or despite the same film thickness, the duration of treatment may change accordingly due to fluctuations in control of the raw material gas and temperature. The durations of the primary procedure S09 in different batches may fluctuate around a value T0, where T0 is referred to as the reference value of the duration of the primary procedure. T0 may be an arithmetic average of the durations of different primary procedures. The ratio between the maximum fluctuation and T0 may be indicated by a, which is called an adjustment factor for duration of the primary procedure in the present invention. Therefore, as for different devices and fabrication processes, it is required to adjust frequently the duration of the primary procedure, so that the duration of the whole heating procedure changes constantly, and the corresponding thermal budget also changes significantly, which is not conducive to reasonably optimize the process treatment duration.

Figure 2B:
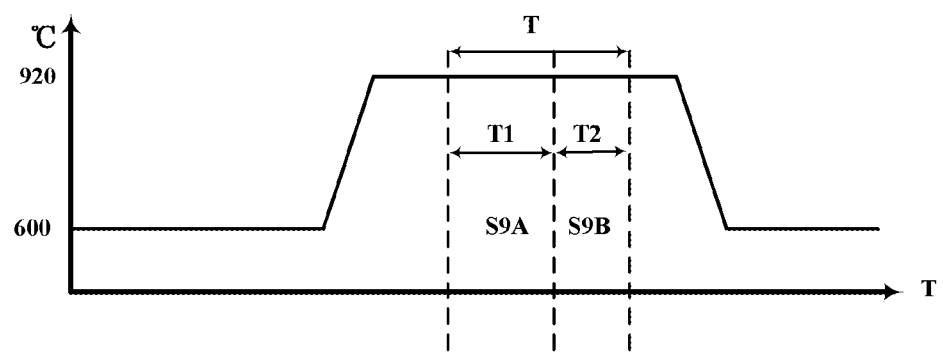

The key of the present application is to maintain the stability of the thermal budget of a specific process step. In case that in the design stage of an integrated circuit, the thermal budget of each step is stabilized, the thermal budget of the whole device is also stabilized. To this end, according to the present invention, the primary procedure is followed by a virtual process step in the heating procedure flow. Namely, the primary procedure S09 is divided into two steps of S9A and S9B, as shown in FIG. 2B. Step S9A is still applied to the original primary procedure, for example thermal oxidation. According to the embodiment of FIG. 1 and Table 1, the specific value of the first duration T1 for step S9A is reasonably adjusted according to the forming speed of the thin film and the desired thickness. In particular, the duration reference value T0 of the above primary procedure is 15 minutes, and the adjustment factor for duration of the primary procedure a is generally less than or equal to 10%. Step S9B is a virtual process step, or called a dummy process step, which intends to control the thermal budget of the current process, namely the total duration in the furnace. The specific treatments in this step may vary according to different device constructions. In particular, the treatment for example may involve an annealing step in $N_2$ atmosphere. Namely, nitrogen is introduced into the furnace and the furnace stays at the high temperature of the primary procedure S9A for a certain time. In this case, annealing helps to remove defects, and the introduced nitrogen will not react with silicon in the substrate, which will not bring about addition problems in the device. The duration of the virtual process step S9B is a second duration T2. The specific value of T2 is determined by the total thermal budget of the heating procedure and the duration of the primary procedure T1. Namely, the sum of T1 and T2 is a constant T, which is determined by requirements in film thickness in the primary procedure.

T1 and T2 can be determined by requirements in film thickness in the primary procedure. In particular, the duration of the primary procedure T1 and that of the virtual process T2 satisfy the following conditions: $T1+T2=(1+\alpha)\times T0$, where T0 is the reference value of the duration of the primary procedure and may be an arithmetic average of the durations of different is primary procedures; a is the adjustment factor for duration of the primary procedure and may be the ratio between the maximum fluctuation of T1 with respect to T0 and T0, and a is generally less than or equal to 10%. When the reference value of the duration of the primary procedure T0 is 15 minutes and the adjustment factor for duration of the primary procedure a is 10%, the duration of the virtual process T2 is 2 minutes if the duration of the primary procedure T1 for a certain batch is reduced to 14.5 minutes, the duration of the virtual process T2 is 0 5 minute if the duration of the primary procedure T1 for another batch is increased to 16 minutes, and so on.

Furthermore, T0 and a can be reasonably adjusted according to different thicknesses, forming speeds of the film, as long as the sum of T1 and T2 is a constant value.

In this way, by inserting the virtual process step S9B, the sum of T1 and T2 can be adjusted reasonably and the duration of the whole heating procedure can be determined (each of other high temperature steps, e.g. S06, S07, S08, S10, S11, S12, S13 can be determined according to the configurations of the air inlet or discharge of the reaction furnace and the heating device, and the durations of each step are constant for a certain device), so that this sum can still be maintained at a constant value even when the duration of the primary procedure changes, which facilitates the subsequent thermal budget. The remaining steps are similar with those shown in FIG. 1 and Table 1, and the description thereof is not repeated herein for simplicity.

In the method for optimizing heating procedures according to the present invention, by following the primary procedure with a virtual procedure in such a manner that the total duration of the whole heating process remains constant, it is beneficial to maintain a stable thermal budget, and further beneficial to maintain a stable device performance.

Although the present invention has been described with reference to one or more exemplary embodiments thereof, it is apparent for the skilled in the art that various suitable modifications and equivalents to the process flow are possible without departing from the scope of the present invention. Furthermore, according to the disclosed teaching, many scenario or material specific modifications are possible without departing from the scope of the present invention. Therefore, the present invention is not intended to be limited to the specific embodiments disclosed as the best implementation for carrying out the present invention, and the disclosed process flow method should comprise all embodiments falling within the scope of the present invention.

The invention claimed is:

1. A heating method for maintaining a stable thermal budget, comprising:
    a heating step for increasing the temperature in a reaction furnace from a first temperature to a second temperature;
    a primary procedure step for forming a thin film by treating a wafer, which occupies a first duration T1;
    a virtual process step, which occupies a second duration T2;
    a cooling step for decreasing the temperature in the reaction furnace from the second temperature to the first temperature;
    characterized in that, the sum of said first and second duration is a constant.

2. The heating method for maintaining a stable thermal budget according to claim 1, wherein said primary procedure is thermal oxidation for forming an oxide film.

3. The heating method for maintaining a stable thermal budget according to claim 1, wherein said constant is determined according to the control on the thickness of the film formed by the primary procedure.

4. The heating method for maintaining a stable thermal budget according to claim 3, wherein said first duration T1 and second duration T2 can be adjusted.

5. The heating method for maintaining a stable thermal budget according to claim 4, wherein $T1+T2=(1+\alpha)\times T0$, where T0 is the arithmetic average of the durations of primary procedures in various batches, $\alpha$ is the ratio between the maximum change in the durations of primary procedures in various batches and T0.

6. The heating method for maintaining a stable thermal budget according to claim 5, wherein a is less than or equal to 10%.

7. The heating method for maintaining a stable thermal budget according to claim 1, wherein said virtual process step is to anneal in $N_2$ atmosphere.

* * * * *